United States Patent
Casarsa (10) Patent No.: US 7,900,103 B2
(45) Date of Patent: Mar. 1, 2011

(54) SCAN CHAIN ARCHITECTURE FOR INCREASED DIAGNOSTIC CAPABILITY IN DIGITAL ELECTRONIC DEVICES

(75) Inventor: Marco Casarsa, Vaprio d'Adda (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 538 days.

(21) Appl. No.: 11/963,036

(22) Filed: Dec. 21, 2007

(65) Prior Publication Data

US 2008/0155365 A1    Jun. 26, 2008

(30) Foreign Application Priority Data

Dec. 22, 2006  (EP) .................................... 06026788

(51) Int. Cl.
  *G01R 31/3177*  (2006.01)
  *G01R 31/40*  (2006.01)
(52) U.S. Cl. ........................................ 714/726; 714/733
(58) Field of Classification Search .................. None
  See application file for complete search history.

(56) References Cited

U.S. PATENT DOCUMENTS

| | | | |
|---|---|---|---|
| 5,313,470 A | 5/1994 | Simpson | 371/22.3 |
| 5,488,318 A | 1/1996 | Vajapey et al. | 326/46 |
| 6,453,436 B1 | 9/2002 | Rizzolo et al. | 714/726 |
| 6,895,540 B2 | 5/2005 | Chen et al. | 714/726 |
| 2005/0108604 A1 | 5/2005 | Wong | 714/726 |
| 2005/0235184 A1* | 10/2005 | Yamauchi | 714/726 |
| 2005/0283691 A1* | 12/2005 | Chae | 714/726 |
| 2007/0168798 A1* | 7/2007 | Cooke | 714/726 |

* cited by examiner

*Primary Examiner* — Robert Beausoliel
*Assistant Examiner* — Dipakkumar Gandhi
(74) *Attorney, Agent, or Firm* — Lisa K. Jorgenson; Allen, Dyer, Doppelt, Milbrath & Gilchrist, P.A.

(57) ABSTRACT

A scan chain architecture includes a cascade of flip-flop cells each having at least one input and output or an inverted output. The output or inverted output of a flip-flop is connected to the input of the subsequent flip-flop. The connection between two consecutive flip-flops of the scan chain is selected according to the status of a given flip-flop cell, the status of a previous cell, and the status of the connection between these cells.

23 Claims, 4 Drawing Sheets

SCAN CHAIN ARCHITECTURE FOR INCREASED DIAGNOSTIC CAPABILITY IN DIGITAL ELECTRONIC DEVICES

FIELD OF THE INVENTION

The present invention relates in its more general aspect to an improved scan chain architecture, belonging to the field of Design For Testability techniques, such as may be used on digital devices in order to increase the diagnostic capability of fault categories which prevent the device scan chain to shift.

BACKGROUND OF THE INVENTION

As is known in this specific technical field, the complex System-on-Chip Integrated Circuits developed use the "Design For Testability" structured technique of the scan chains to allow the Automatic Test Patterns Generation (ATPG) tool to reach the very high standard quality currently required by the customer and, at the same time, reduce the generation time of the patterns.

The currently available scan chain structures, inserted in the device using commercial tools, are built by stitching the device flip-flops to satisfy different constraints such as: minimization of routing (physical scan insertion), minimization of hold time problem, by hierarchical name, and so on.

Figure 1:
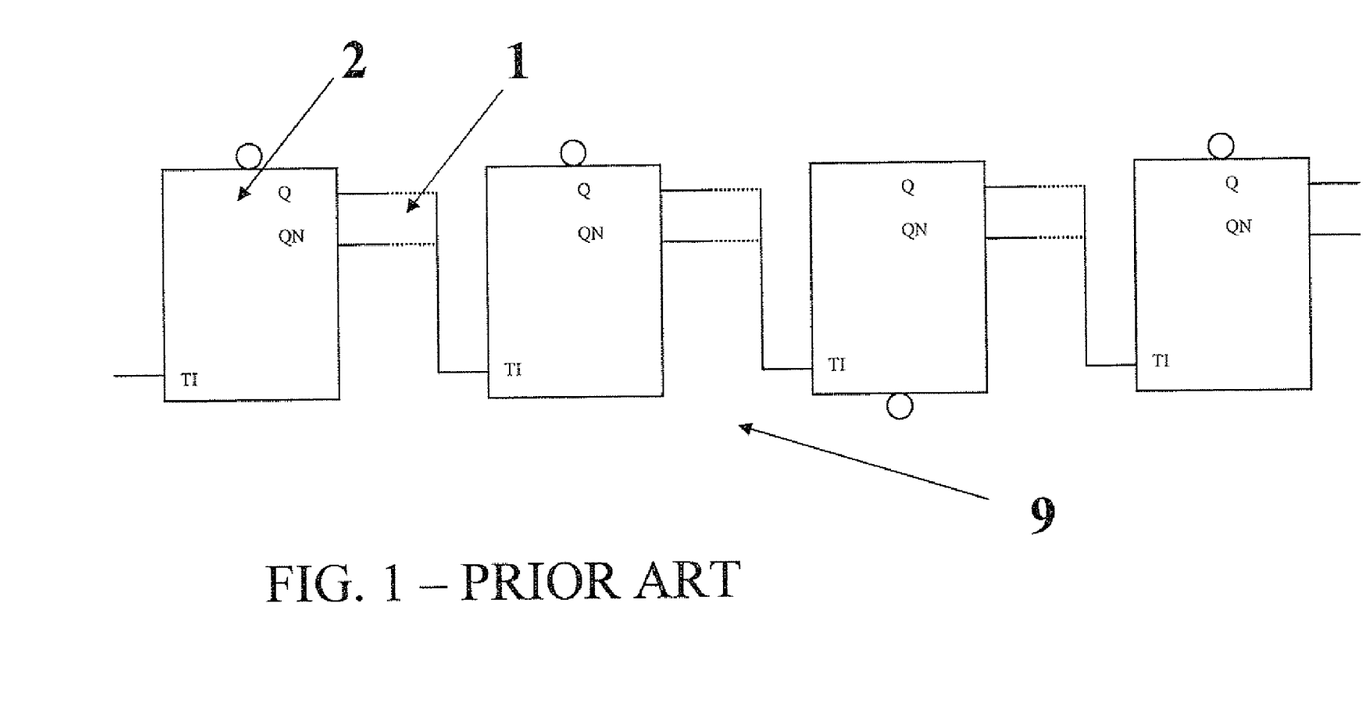
FIG. 1 schematically shows the typical connections between consecutive flip-flops of a scan chain of known type, wherein the output or the inverting output of a given flip-flop can be connected to the input of the subsequent flip-flop.

At the end of the scan chain insertion phase, the structure that normally is inserted resembles the one shown in FIG. 1. The typical connections between two consecutive flip-flops 1 of a scan chain 9 are performed considering one or a combination of the above constraints. Provided that all flip-flops have both a normal output, identified as Q, and an inverted output QN, in some cases Q happens to be connected to the flip-flop input TI of the next flip-flop of the scan chain, while in the other cases the connection is between QN and TI. In other words, the outputs Q or QN of a given flip-flop are linked to the input of the subsequent flip-flop not according to a specific rule, but rather according to the specific requirement or requirements of the specific scan chain.

This limitation does not allow obtaining better performances from a scan chain set up according to the prior art techniques. Extensive analysis has been performed in attempt to find solutions, based on specific algorithms which help in finding the root cause of the problem (e.g. drive mapping method), but they very often require multiple patterns to be run related to the target defect, and specific tools which have to know the whole design structure during the phase in which failure data (obtained during testing phase) are post-processed to get the failure location of the failed device (i.e. an ATPG tool).

The difficulty is that of providing an improved connection configuration having characteristics allowing performing the diagnosis of possible failures while in some cases requiring the knowledge of the scan chain structure only, thus overcoming the limits which still affect the devices realized according to the prior art, and introducing only a small, and often null, area overhead into the hardware structure.

SUMMARY OF THE INVENTION

In view of the foregoing background, it is therefore an object of present invention to modify the scan chain structure of the known type by using dedicated logic circuitry to connect consecutive flip-flops belonging to a same scan chain. In this manner it is possible to improve the diagnostic capability by a more efficient use of the asynchronous initialization of the scan chain flip-flops.

Moreover, to perform a diagnosis of the failures, the status of the scan chain flip-flops may be initialized using an asynchronous pin (set or reset), which is typically present in all the flip-flops adopted in digital design and connected to the external reset or set when the scan mode is enabled.

In other words, the invention relates to a modification of the logic circuitry connecting consecutive flip-flops of the same scan chain, to achieve the diagnostic capability improvement which allows the identification of predetermined fault categories preventing the scan chain from properly shifting. Since all the flip-flops adopted in digital designs are typically asynchronously initialized using a dedicated set or reset pin, the above-proposed approaches address most digital devices.

BRIEF DESCRIPTION OF THE DRAWINGS

The characteristics and advantages of the improved scan chain architecture according to the invention will be apparent from the following description of embodiments thereof given by way of indicative and non limiting example with reference to the annexed drawings. In such drawings.

DETAILED DESCRIPTION OF THE PREFERRED EMBODIMENTS

Figure 2:
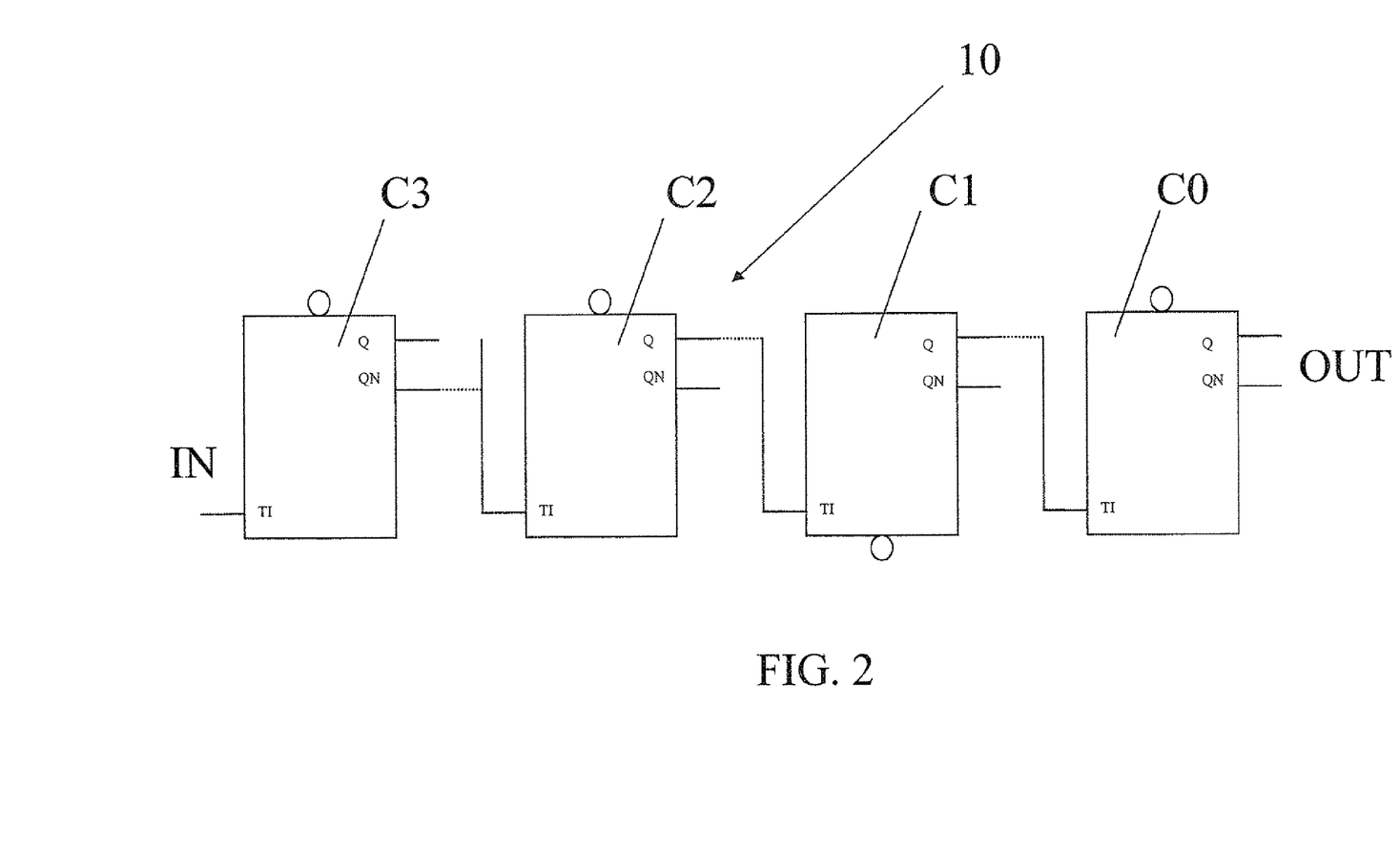
FIG. 2 schematically shows a scan chain formed by flip-flop cells of known type but following the rules provided by the present invention.
Figure 3:
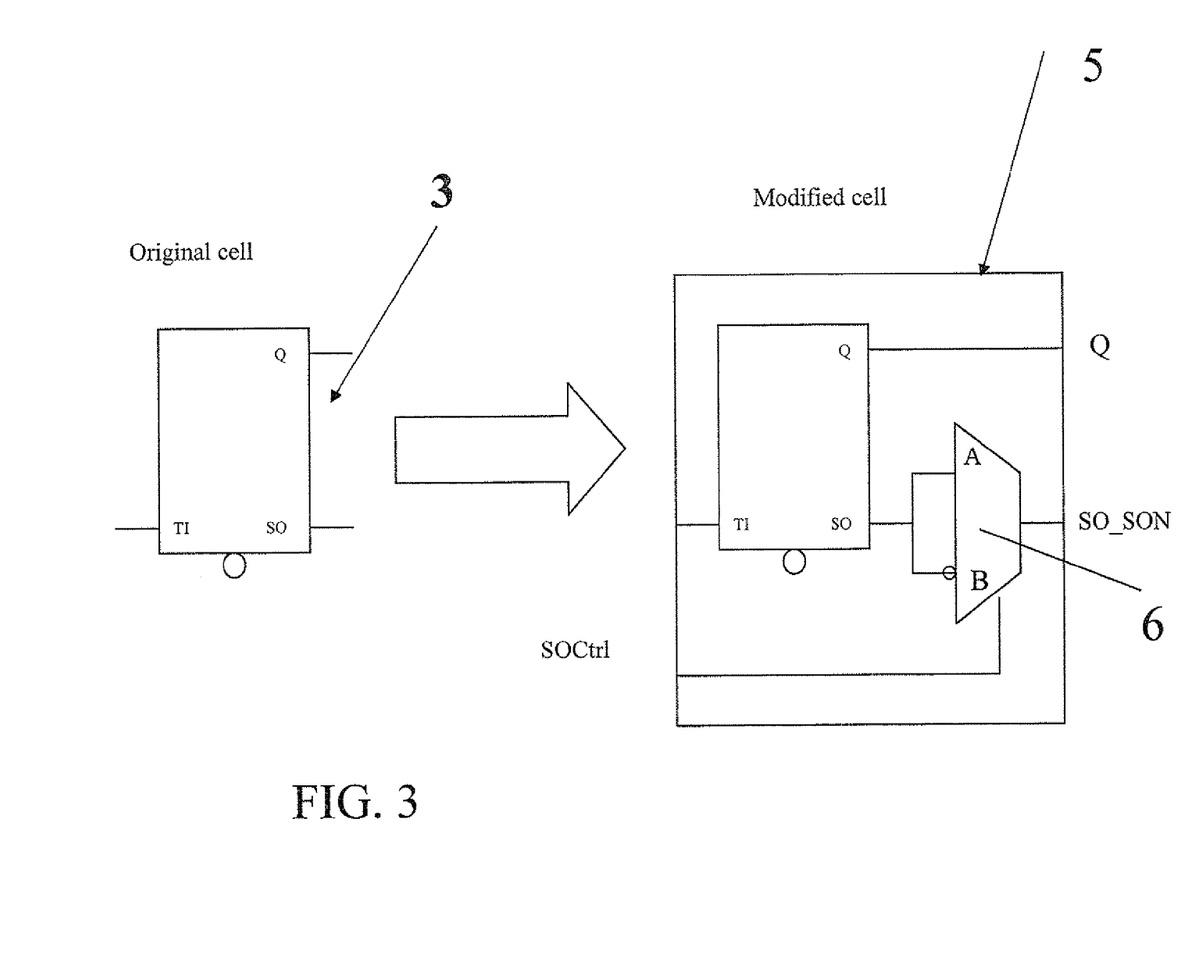
FIG. 3 schematically shows a known flip-flop cell together with a modified cell according to the present invention and responsive to control signals disclosed in details in the following description.
Figure 4:
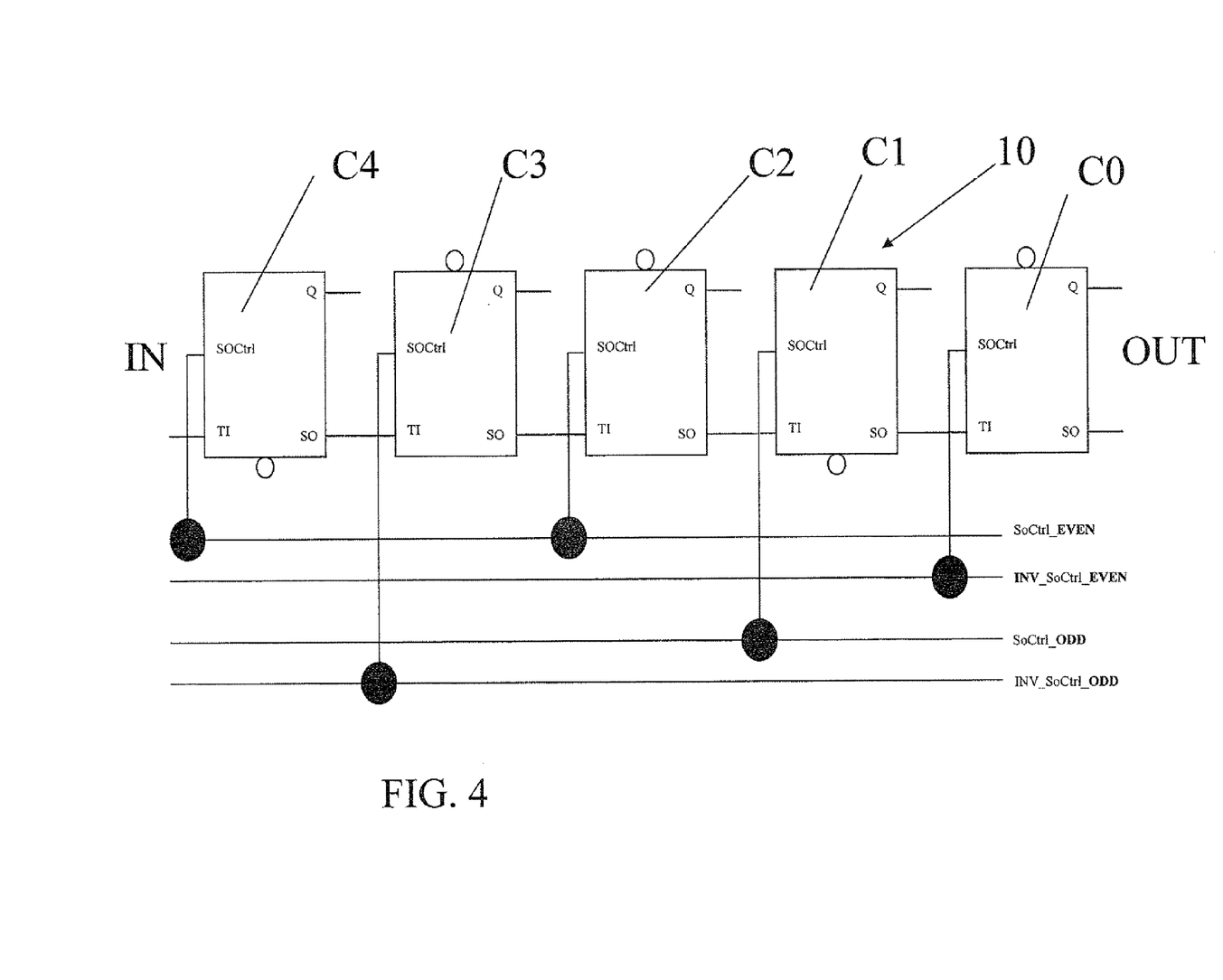
FIG. 4 schematically shows a scan chain structured with flip-flop cells modified according of the present invention.

With specific reference to the example of FIGS. 2, 3 and 4, an improved scan chain architecture 10 according to the present invention is disclosed.

The architecture 10 may be structured with a scan chain of flip-flop cells of known type, for instance those indicated with 2 in FIG. 1, that are linked one to the other according to the rules provided by the present invention and disclosed hereinafter.

As an alternative, the architecture 10 may be structured with a scan chain of flip-flop cells 5 that have been modified with respect to known flip-flop cells 3, as shown in FIGS. 3 and 4.

A low cost/capability approach will be disclosed first and a high cost/capability approach will be disclosed later. Furthermore a possible middle cost/capability approach will be disclosed as a sub-case of the low cost/capability one.

Briefly explained, the two main approaches are based on different ways of connecting together consecutive flip-flops cells in the same scan chain. The low cost/capability approach presents advantages in term of area overhead, while the high cost/capability approach presents advantages in terms of performance.

In disclosing the low Cost/Capability approach we will start by considering a library of known flip-flops cells 2 having both a Q output and a QN (inverted Q) output. It should be noted that this way of indicating the output of the cell 2 is unconventional and other alternative ways may be adopted. The only important thing is that the flip flop cell might have a main output Q or SO and inverted output QN or SON. If the inverted output is not present, it would be possible to insert an inverted connected to the main output thus obtaining an inverted logic value at the inverter output.

The difference between the Q, QN and SO, SON resides in their functional scope. The output Q, ON are functional outputs and fast signals while SO, SON are slower signals that are provided in the flip flop cells to be dedicated to the scan routing of the scan chain. However, the logic values of the output Q generally correspond to the logic value of the output SO and this is also true for the other outputs QN, SON. If the logic values of the output Q should not correspond to the logic value of the output SO, only the pins SO/SON could be used.

Generally speaking, the key point that allows improving the diagnostic capability with respect to a failure of the scan chain shifting is to have, for example, at every shift clock cycle, a toggling on the flip-flop output to identify and point out the element or event that broke the scan shifting.

Before proceeding further with the description, it may be worthwhile noting that the shifting operation is sequential to an asynchronous initialization phase wherein all the flip-flop cells of the chain are pre-charged to a predetermined status. In other words, there is typically the need to force an asynchronous set-reset phase before starting the toggling phase.

To achieve such a toggling, the only requirement is typically to execute a post analysis of the scan structure, i.e. after the scan insertion is performed, to slightly modify the scan chain architecture.

To do so it has been decided to take in consideration the last cell of the chain closer to the scan chain output (OUT) as the first element and proceeding back up to the first cell of the chain, the one closer to the input IN, that has been considered as the last element.

So, starting from the last scan chain element C0 (the nearest to the scan chain output), it is desired to check if the status, for instance $S_0$, of that element C0 of the scan chain is asynchronously initialized to 0 (reset) or 1 (set). The next step is to check the status, for instance $S_1$, of the previous flip-flop C1 in the scan chain and the logic connection during the scan shift between these two flip-flops ($S_1$-conn-$S_0$: we can consider this connection equal to '1' in case of inversion and '0' in case of buffer—no inversion—).

Depending on the above parameters the connection between these two flip-flops C0, C1 may be modified to have an inversion among them. To prevent potential problems in, the silicon structure that is already physically placed, as previously mentioned, the flip-flops may desirably have both the output Q and QN; as an alternative these flip-flop cells C0, C1 might have a dedicated output of the kind SCAN OUT, that is identified with SO in FIG. 3, and is delayed to prevent a hold problem during the physical stitching. In this specific case using the output SO even an inverted output SON may desirably be present.

At the end, the rule to be applied can be summarized as follows:

$$INV_{x,x-1} = NOT(S_x \text{XOR} S_{x-1} \text{XOR} S_x\text{-conn-}S_{x-1}) \quad (\text{Eq. 1})$$

where $INV_{x,x-1}$ is a logic function that is for modifying the connection. When $INV_{x,x-1}$ is equal to 1 the connection between two consecutive flip-flops Cx, Cx−1 is inverted while, when INVx,x−1=0 the connection between two consecutive flip-flops Cx, Cx−1 is not inverted.

In other words, given an original connection between two consecutive flip-flops Cx, Cx−1, the formula Eq. 1 determines if the connection between said two consecutive flip-flops Cx, Cx−1 has to be inverted with respect to the original connection (INV x,x−1=1), or if it has to be maintained equal to the original connection (INV x, x−1=0).

More particularly, the original connection is the connection between two consecutive flip-flops of the scan chain before the application of the formula INV x,x−1=NOT (Sx XOR Sx−1 XOR Sx-conn-Sx−1). As already stated before, after the application of the formula, and only if INV x,x−1=1, the two consecutive flip-flops of the scan chain are connected through a connection inverted with respect to the original connection; otherwise, after the application of the formula and if INV x,x−1=0, the two consecutive flip-flops of the scan chain remain connected through the original connection.

Another alternative or dual relation might be used in the case of different logic factors to achieve the same result.

The output of a good shift-out, after the external reset/set has been applied, will be a sequence of toggling at every shift clock cycles.

A modification in the connections between two consecutive flip-flops C0, C1, ... Cx, Cx+1 ... , Cn−1; Cn of the scan chain achieves an inversion of the input TI of the $C^{x-th}$ flip-flop of the scan chain, depending on the status of the same flip-flop $C^{x-th}$ and on the status of the previous $C^{(x+1)th}$ flip-flop. Moreover, even the status of the connection between those flip-flops is taken into consideration.

Again, the flip-flops of the scan chain are here supposed to be numbered increasingly from the flip-flop cell C0 closer to the scan chain output (OUT) to the one Cn closer to the scan chain input (IN). Provided that all flip-flops of the scan chain have both Q and QN (inverted Q) outputs, the connection between the flip-flops respects the following rules: the connection between two consecutive flip-flops Cx, Cx−1 is inverted, if INVx,x−1=1, while the connection between two consecutive flip-flops Cx, Cx−1 is not inverted, if INVx,x−1=0, according to the previous relation of Eq. 1 wherein $S_x$, $S_{x-1}$, and $S_x$-conn-$S_{x-1}$ indicate the status of the two consecutive flip-flops after asynchronous set or reset initialization and of the logic relation of the original connection between them, respectively. In other words, provided that two consecutive flip-flops of the scan chain are connected with an original connection, the formula INVx,x−1 is processed, and if INVx, x−1=1, the original connection between the consecutive flip-flops Cx, Cx−1 has to be inverted, obtaining an inverted connection with respect to the original connection. If INVx, x−1=0, the original connection between the consecutive flip-flops Cx, Cx−1 does not have to be inverted, and the original connection is maintained. The term ($S_x$-conn-$S_{x-1}$) is considered 1 in case of an inversion and 0 in the case of a buffer (no inversion). This is substantially the low cost approach shown in FIG. 2.

Below there is a list of fault categories that can be identified and isolated by recording the failures occurring to the output of a scan chain.

Single Hold Problem

In this case it is possible to detect and isolate the fault because, starting from a definite relation with respect to the position where the hold time occurs in the scan chain, the output is inverted.

Cluster Hold Problems

This case is similar to the Single Hold problem, but in this case only the first element of the cluster (the one closer to the input of the scan chain Scan in) will be highlighted. This kind of problem could appear in case of clock tree buffer delayed with respect to the correct timing, when the flip-flops clocked by this driver are stitched consecutively in the scan chain (this is probable in the case of physical insertion).

Multiple Separated Single Hold Problems

In this case it is possible to detect and isolate every fault. The output sequence matches the expected value at some clock cycles, while being inverted at others, depending on the number of single Hold problem in the scan chain.

Double Consecutive Hold Problems

In this case it is not possible to isolate the faults, but only to detect their number. This is because the double hold problem, which probably will occur rarely because there should be a different skew among three consecutive flip-flops (the first one, CX+2, closer to scan chain input should have no delay cycles; the next flip-flop, CX+1, one delay cycle and the third one, CX, two delay cycles), does not generate a toggle on the output, but it only reduces the scan chain length.

Triple Consecutive Hold Problems

In this case it is possible to detect and isolate the faults closer to the scan chain output. As noticed above for the Double Consecutive Hold Problems, this case should have a low probability.

Single Stuck-at 0/1 on TI

In this case it is possible to detect and partially isolate the problem. In general, the reason for the impossibility of completely isolating the problem is related to the fact that the status of the scan chain elements, $S_x$ and $S_{x+1}$, have a fixed relation between them, so that a couple of faults on $S_x$ and $S_{x-1}$ cannot be distinguished. The value of the fault depends on the location where the fault is detected and the set/reset asynchronous signal used to initialize the related flip-flops.

Multiple Stuck-at 0/1 on TI

In this case it is possible to detect and partially isolate the faults closer to the scan chain output. All the other problems cannot be analyzed because the scan chain is broken.

If the flip-flops having both Q and QN or the alternative SO and SON outputs are missing from the library, the approach proposed may be considered a middle cost approach.

As a matter of fact, in this possible case two alternative choices can be selected to implement the middle cost/capability approach described above: developing a dedicated library of flip-flops which implement the required double output (just as reference SON/QN in case SO/Q is available), or inserting an inverter between the output SO/Q and the input TI according to the relation explained above, so according to Eq. 1.

The High Cost/Capability approach is basically similar to the previously disclosed low cost approach but, to improve the diagnostic capability of the previous approach in the cases where the detection or the isolation is not possible, some modifications to the scan chain structure and cells are performed.

For implementing this second approach it would be suitable adopting flip-flops 5 having two separate outputs: one for the functional behavior Q and one for the scan chain stitching SO.

The simpler and smaller proposal for the implementation of the high cost/capability approach is to modify the basic flip-flop cells 3, introducing a control signal SOCtrl and a further controlled output SO_SON.

Making reference to FIG. 3 it may be appreciated that the cell 5 includes the cell 3 and a dedicated logic circuitry 6, for instance a simple multiplexer circuit 6 enabled by the signal SOCtrl. This multiplexer 6 has a couple of inputs: A, that is equivalent to SO, and B, that is equivalent to the inverted value of SO (indicated as SON).

Assuming all flip-flops cells have at least a main output Q, for the functional behavior, and an output SO for the scan chain stitching, the dedicated logic circuitry 6 is suitably introduced to allow toggling of the SO output depending on the value of the control signal SOCtrl. More specifically SO_SON is equal to SO whenever SOCtrl=0, while SO_SON is equal to inverted SO whenever SOCtrl=1. In other words, there is no inversion when SOCtrl=0 and there is inversion when SOCtrl=1.

The logic structure of the modified cell 3 is shown in FIG. 3 as cell 5 and in case of an asynchronously reset flip-flop (a cell with set capability requires similar modifications).

At this point it is necessary to analyze how the SOCtrl signal is controlled for every flip-flop of the device to increase the diagnostic capability with respect to the low cost/capability approach. The basic idea is that of having three different configurations: one behaves exactly like the previous one (i.e. one toggling for every flip-flop), the second approach generates or not an inversion depending on the flip-flop position in the scan chain (odd flip-flops have inversion, while even ones don't have the inversion, i.e. one toggle every two flip-flops), and a third configuration that is a complementary configuration with respect to the second one (i.e. even ones have inversion, while odd ones do not).

An implementation of a complete scan chain structure realizing the high cost/capability approach is shown in FIG. 4. Two control signals SOCtrl_ODD and SOCtrl_EVEN and the related inverted signals (INV_SOCtrl_ODD and INV_SOCtrl_EVEN) have been introduced, and have to be controlled during the scan chain integrity tests as sequentially described below.

The signals SOCtrl_ODD and INV_SOCtrl_ODD are used for the Flip-Flop cells being in odd position (C1, C3, ...) while the signals SOCtrl_EVEN and INV_SOCtrl_EVEN are used for the even positions (C0, C2, ...).

Each Flip-Flop cell is connected to the respective inverted (INV_SOCtrl ...) connection or non inverted (SOCtr_1 ...) connection according to the rule reported in the equation 1; if an inverted connection is required ($INV_{x,x-1}$ IS EQUAL TO 1) a connection to INV_SOCtrl_(ODD/EVEN) is established otherwise to the other signal SOCtrl_(ODD/EVEN). The first test to be performed is in line with the previous description and keeps the same functionality of the low cost/capability approach test.

In such a case it is enough to force both the control signal SOCtrl_ODD and SOCtrl_EVEN to the ground potential GND, and as a consequence the two inverted signals INV_SOCtrl_ODD and INV_SOCtrl_EVEN are forced to the potential value of the supply voltage VDD.

if this test should fail and some mismatches should not be isolated, additional tests can be applied.

A second test can be performed by forcing the potential value of the signal SOCtrl_ODD to VDD (thus INV_SOCTRL_ODD to GND) and the SOCtrl_EVEN to GND. This operation is enough to isolate double consecutive Hold Time, because there is always an inversion between two consecutive flip-flops that allows the isolation of the problem.

A third possible test is complementary to the second one, so SOCtrl_EVEN will be forced to VDD, while SOCtrl_ODD is forced to GND. This testing mode will confirm the failure location of the second test. Just for completeness sake it should be noted that an enable pin TE, not shown in the drawings, is normally used to enable between the input pin TI, starting the scan mode, and another input pin D, starting the user mode, Well, the testing mode of the present invention allows the isolation of the stuck-at 0 on TE closer to scan out, because applying these two tests the User Data will be the same (the reset state of the device flip-flops does not change) but the TI input will be complementary depending on the previous SOCtrl status.

The combination of these testing methods allows also the isolation of the Stuck-at 0/1 on TI closer to the scan chain output. This is because only one of these three configurations will change the logic behavior between the status $S_x$ and $S_{X+1}$ of two consecutive flip-flops.

Summarizing, the architecture proposed in FIG. 4, respect the previous described low/middle cost approach, allows isolating the Double Consecutive Hold Problem, the Triple consecutive Hold problem, and the Single Stuck-at 0/1 on TI, the isolation of the stuck-at 0 on TE faults closer to scan out covering in this way several possible sources of broken scan chain problems.

In particular, this structure allows the diagnosis and isolation of several typologies of Hold problems (also multiple), which can really be one of the main problems for the submicron technology. The only limitation to this structure is the case of Multiple Stuck-at in the same scan chain: in this case the diagnostic capability is the same as the low cost/capability approach.

With the architecture shown in FIG. 4 it is also possible to investigate about an additional couple of faults related to the pin SOCtrl. These faults can be detected and isolated by applying the set of patterns depicted above because they own a special signature which will allow identifying this family of faults.

Of course, as may be appreciated by one skilled in the art, besides the approach proposed in FIG. 4 other alternative structures are possible. For instance, instead of having four control lines as reported above, we can use just two lines (i.e. a SOCtrl_ODD and a SOCtrl_EVEN signals) and build a dedicated library in which, for every original flip-flop element, there are two modified flip-flops 5 each of them with different polarity of the SOCtrl signal. In this way, a modified flip-flop can be used instead of the inverted control line INV_SOCtrl_(ODD or EVEN) when an inverted control signal value is needed. In particular, in one flip-flop cell the output SO_SON is kept equal to SO whenever SOCtrl is set to GND, while in the other flip-flop cell this relation holds whenever SOCtrl is set to VDD. This approach will save wiring in the design but would require a more complex library.

Finally it worthwhile to note that the control signals in FIG. 4 (SOCtrl_ODD, INV_SOCtrl_ODD, SOCtrl_EVEN, INV_SOCtrl_EVEN) may be provided by external pads or by a dedicated test logic portion.

The invention claimed is:

1. A scan chain architecture comprising:
a cascade of flip-flop cells each having at least one input and at least one output, a given and a previous flip-flop cell of the cascade thereof having a connection associated therewith selected according to a status of the given flip-flop cell, a status of the previous flip-flop cell and a status of the connection between them according to the following relation $$INV_{x,x-1} = NOT(S_x \text{XOR} S_{x-1} \text{XOR} S_x\text{-conn-}S_{x-1}),$$

where $S_x$, $S_{x-1}$, and $S_x$-conn-$S_{x-1}$ respectively indicate the status after an initialization of the given and previous consecutive flip-flop cells and the status of an original connection between them, given that the connection between them is inverted with respect to the original connection if $INV_{x,x-1}=1$.

2. The scan chain architecture according to claim 1, wherein each of said flip-flop cells includes an alternative output and an inverted output used as a complementary signal of the alternative output and using these further outputs to connect consecutive flip-flop cells according to the relation and in the alternative to the output or an inverted output of said flip-flop cells.

3. The scan chain architecture according to claim 2, wherein an inverter is between the alternative output and an input of two consecutive flip-flop cells when the inverted output is not available in a flip-flop library and a connection through the inverted output is desired.

4. The scan chain architecture according to claim 2, wherein each of said flip-flop cells receives a control signal, and further comprising dedicated logic circuitry for providing a further controlled output according to a logic state value of the control signal.

5. The scan chain architecture according to claim 4, wherein said dedicated logic circuitry comprises a multiplexer for receiving as inputs the alternative output and the inverted output and for providing the further controlled output according to the logic state value of the control signal.

6. The scan chain architecture according to claim 5, wherein the further controlled output is toggled from the alternative output according to said logic state value of said control signal.

7. The scan chain architecture according to claim 5, wherein each of said flip-flop cells comprises an asynchronous reset or set input.

8. The scan chain architecture according to claim 5, further comprising circuitry to provide two different control signals for driving odd position flip-flop cells and even position flip-flop cells.

9. The scan chain architecture according to claim 8, wherein said circuitry is to provide corresponding inverted control signals, and wherein each flip-flop cell is coupled to the respective inverted control signal connection or the non-inverted control signal connection according to the relation; and wherein if an inverted connection is required a connection to inverted control signals is established and otherwise a connection is established to the other control signals.

10. The scan chain architecture according to claim 9, further comprising at least one of external pads and a test logic portion to provide the control signals and the inverted control signals.

11. The scan chain architecture according to claim 1, wherein an inverter is between an output and an input of two consecutive flip-flop cells when an inverted output is not available in a flip-flop library and a connection through an inverted output is desired.

12. A method of configuring a scan chain architecture comprising:
configuring a cascade of flip-flop cells each having at least one input and at least one output; and
selecting a connection between a given and a previous flip-flop cell of the cascade thereof according to a status of the given flip-flop cell, a status of the previous flip-flop cell and a status of the connection between them according to the following relation $$INV_{x,x-1} = NOT(S_x \text{XOR } S_{x-1} \text{XOR } S_x\text{-conn-}S_{x-1}),$$

where $S_x$, $S_{x-1}$, and $S_x$-conn-$S_{x-1}$ respectively indicate the status after an initialization of the given and previous consecutive flip-flop cells and the status of an original connection between them, given that the connection between them is inverted with respect to the original connection if $INV_{x,x-1}=1$.

13. The method according to claim 12, wherein each of the flip-flop cells includes an alternative output and an inverted output used as a complementary signal of the alternative output and using these further outputs to connect consecutive flip-flop cells according to the relation and in the alternative to the output or an inverted output of the flip-flop cells.

14. The method according to claim 13, wherein an inverter is between the alternative output and an input of two consecutive flip-flop cells when the inverted output is not available in a flip-flop library and a connection through the inverted output is desired.

15. The method according to claim 13, wherein each of the flip-flop cells receives a control signal and comprising dedicated logic circuitry for providing a further controlled output according to a logic state value of the control signal.

16. The method according to claim 15, wherein the dedicated logic circuitry comprises a multiplexer for receiving as inputs the alternative output and the inverted output and for providing the further controlled output according to the logic state value of the control signal.

17. The method according to claim 16, wherein further controlled output is toggled from the alternative output according to said logic state value of said control signal.

18. The method according to claim 16, wherein each of the flip-flop cells comprises an asynchronous reset or set input.

19. The method according to claim 16, further comprising providing two different control signals for driving odd position flip-flop cells and even position flip-flop cells.

20. The method according to claim 19, further comprising configuring corresponding inverted control signals wherein each flip-flop cell is coupled to the respective inverted control signal connection or the non-inverted control signal connection according to the rule reported the relation; and wherein if an inverted connection is required a connection to inverted control signals is established and otherwise a connection is established to the other control signals.

21. The method according to claim 20, wherein at least one of external pads and a test logic portion provide the control signals and the inverted control signals.

22. The method according to claim 16, further comprising providing a dedicated library, wherein for every flip-flop cell, there is a modified flip-flop cell with a different polarity of the control signal to be used in case an inverted control signal value is needed.

23. The method according to claim 12, wherein an inverter is between an output and an input of two consecutive flip-flop cells when an inverted output is not available in a flip-flop library and a connection through an inverted output is desired.

* * * * *

UNITED STATES PATENT AND TRADEMARK OFFICE
CERTIFICATE OF CORRECTION

| | | |
|---|---|---|
| PATENT NO. | : 7,900,103 B2 | Page 1 of 2 |
| APPLICATION NO. | : 11/963036 | |
| DATED | : March 1, 2011 | |
| INVENTOR(S) | : Casarsa | |

It is certified that error appears in the above-identified patent and that said Letters Patent is hereby corrected as shown below:

Column 1, Line 11      Delete: "to shift."
                               Insert: --from shifting.--

Column 1, Line 62      Delete: "of present"
                               Insert: --of the present--

Column 2, Line 20      Delete: "of indicative"
                               Insert: --of an indicative--

Column 2, Line 34      Delete: "of"
                               Insert: --to--

Column 3, Line 2      Delete: "inverted connected"
                               Insert: --inverted output connected--

Column 3, Line 5      Delete: "ON"
                               Insert: --QN--

Column 4, Line 16      Delete: "cycles."
                               Insert: --cycle.--

Column 5, Line 5      Delete: "problem"
                               Insert: --problems--

Column 6, Line 34      Delete: "(SOCtr_1...)"
                               Insert: --(SOCtrl_...)--

Column 6, Line 47      Delete: "if"
                               Insert: --If--

Signed and Sealed this
Sixteenth Day of August, 2011

David J. Kappos
*Director of the United States Patent and Trademark Office*

CERTIFICATE OF CORRECTION (continued)
U.S. Pat. No. 7,900,103 B2

| | |
|---|---|
| Column 6, Line 64 | Delete: "because applying"<br>Insert: --because by applying-- |
| Column 7, Line 41 | Delete: "it worthwhile"<br>Insert: --it is worthwhile-- |
| Column 10, Line 5 | Delete: "reported the"<br>Insert: --reported in the-- |